United States Patent [19]
McAnally et al.

[11] Patent Number: 6,136,700
[45] Date of Patent: Oct. 24, 2000

[54] METHOD FOR ENHANCING THE PERFORMANCE OF A CONTACT

[75] Inventors: Peter S. McAnally, McKinney; Jeffrey Alan McKee, Grapevine; Dirk Noel Anderson, Plano, all of Tex.

[73] Assignee: Texas Instruments Incorporated, Dallas, Tex.

[21] Appl. No.: 08/992,268

[22] Filed: Dec. 17, 1997

Related U.S. Application Data

[60] Provisional application No. 60/033,134, Dec. 20, 1996.

[51] Int. Cl.$^7$ .................................................. H01L 21/44
[52] U.S. Cl. ....................... 438/666; 438/689; 438/696; 438/740; 257/501; 257/646; 257/900
[58] Field of Search ..................................... 438/384, 282, 438/702, 637, 278, 634, 666, 740; 29/578, 571; 148/188; 257/335, 774, 77

[56] References Cited

U.S. PATENT DOCUMENTS

| 4,313,733 | 2/1982 | Briska et al. | 148/188 |
| 4,364,165 | 12/1982 | Dickman et al. | 29/571 |
| 4,543,707 | 10/1985 | Ito et al. | 29/578 |
| 5,286,667 | 2/1994 | Lin et al. | 438/253 |
| 5,578,524 | 11/1996 | Fukase et al. | 438/624 |
| 5,622,596 | 4/1997 | Armacost et al. | 438/702 |
| 5,691,246 | 11/1997 | Becker et al. | 438/702 |
| 5,814,859 | 9/1998 | Ghezzo et al. | 257/335 |
| 5,897,372 | 4/1999 | Howard | 438/637 |

FOREIGN PATENT DOCUMENTS

| 0 680 084 | 11/1995 | European Pat. Off. | H01L 21/768 |
| 0 746 017 | 12/1996 | European Pat. Off. | H01L 21/768 |

*Primary Examiner*—Wael Fahmy
*Assistant Examiner*—William David Coleman
*Attorney, Agent, or Firm*—Jacqueline J. Garner; W. James Brady III; Frederick J. Telecky, Jr.

[57] ABSTRACT

A self-aligned contact (122) to a substrate (12) of a semiconductor device (100) is formed using a stopping layer (110) overlying the substrate (12). The stopping layer (110) comprising a material selected from the group consisting of silicon-rich nitride, silicon-rich oxide, carbon-rich nitride, silicon carbide, boron nitride, organic spin-on-glass, graphite, diamond, carbon-rich oxide, nitrided oxide, and organic polymer. The stopping layer (110) promotes better semiconductor device (100) performance by contributing to greater selectivity with respect to an etch process used to remove an insulating layer (112) formed overlying the stopping layer (110).

6 Claims, 3 Drawing Sheets

METHOD FOR ENHANCING THE PERFORMANCE OF A CONTACT

This application claims priority under 35 USC § 119 (e)(1) of provisional application number 60/033,134, filed Dec. 20, 1996.

TECHNICAL FIELD OF THE INVENTION

This invention relates in general to the field of semiconductor fabrication, and more specifically to a method for enhancing the performance of a contact.

BACKGROUND OF THE INVENTION

Semiconductor device fabrication involves the formation of different components on a substrate using a variety of techniques, such as deposition, patterning, and etching. One component in semiconductor devices is a contact for coupling a layer of material to the underlying substrate or another layer. Depending on the particular application and the desired function, contact may be holes, vias, channels, or other geometric structures. One type of contact is a self-aligned contact. Self-aligned contacts are commonly used to decrease cell areas, which provides increased packing density.

Etches for self-aligned contacts differ from etches for standard contacts because of the presence of an exposed shoulder of, for example, nitride, in the self-aligned contact structure that is very susceptible to etch erosion. Such a shoulder is not present in standard contacts. Because the exposed shoulder is susceptible to etch erosion, the etchant should etch the material on the exposed should at a much slower rate than it etches the material in the proximity of the shoulder. For a given design, higher etch selectivities may increase the contact area. The greater the contact area, the lower the sheet resistance and the better the performance of the semiconductor device. Additionally, higher etch selectivities contribute to preventing electrical shorts near the shoulder.

One method for effecting a high etch selectivity is modifying the chemistry of the etchant. However, adjusting the chemistry of the etchant may lead to the detrimental problem of stop-etch, which is generally an incomplete etch due to polymer build-up. Another method for effecting a high etch selectivity is adjusting the etch process parameters, such as temperature. Adjusting such parameters is commonly referred to as "knob" changes. However, "knob" changes may not always be accomplished in a timely fashion and therefore may be inadequate to effectively increase selectivity.

SUMMARY OF THE INVENTION

In accordance with the present invention, disadvantages and problems associated with a method for enhancing the performance of a self-aligned contact have been substantially reduced or eliminated.

In accordance with one embodiment of the invention, a method for forming a contact to a substrate of a semiconductor device includes forming a stopping layer overlying the substrate, the stopping layer comprising a material selected from the group consisting of silicon-rich nitride, silicon-rich oxide, carbon-rich nitride, silicon carbide, boron nitride, organic spin-on-glass, graphite, diamond, carbon-rich oxide, nitrided oxide, and organic polymer. The method further includes forming an insulating layer overlying the stopping layer and etching portions of the insulating layer to define a contact region. The method also includes removing portions of the stopping layer in the contact region.

In accordance with another embodiment of the invention, a semiconductor device formed in a surface of a substrate and having a gate and a self-aligned contact is provided. The transistor includes a first conductive material forming a portion of the gate and a second conductive material forming a portion of the self-aligned contact, the conductive material contacting the substrate. The semiconductor device further comprises a dielectric material structure contacting both the first conductive material and the second conductive material, the dielectric material selected from the group consisting of silicon-rich nitride, silicon-rich oxide, carbon-rich nitride, silicon carbide, boron nitride, organic spin-on-glass, graphite, diamond, carbon-rich oxide, nitrided oxide, and organic polymer.

Important technical advantages of the invention include providing a method for increasing the selectivity with respect to an etch in a self-aligned contact structure. Therefore, the invention provides a method for forming a self-aligned contact with a reduced possibility of a short near the shoulder of a self-aligned contact. Furthermore, the invention allows for maximizing the area on the substrate that is in contact with a self-aligned contact. The large contact area reduces the contact resistance and therefore increases the performance of the semiconductor device.

Other important technical advantages of the present invention include increasing etch selectivity without necessarily adjusting the chemistry of the etchant. Therefore, problems previously associated with such a procedure, such as stop etch, may be avoided. Furthermore, greater etch selectivity may be achieved without requiring "knob" changes, which may be ineffective or may adversely affect other portions of the manufacture of the semiconductor device.

BRIEF DESCRIPTION OF THE DRAWINGS

For a more complete understanding of the present invention, and for further features and advantages, reference is now made to the following description taken in conjunction with the accompanying drawings, in which.

DETAILED DESCRIPTION OF THE INVENTION

An embodiment of the present invention and its advantages are best understood by referring to FIGS. 1A through 3 of the drawings, like numerals being used for like and corresponding parts of the various drawings.

Figure 1A:
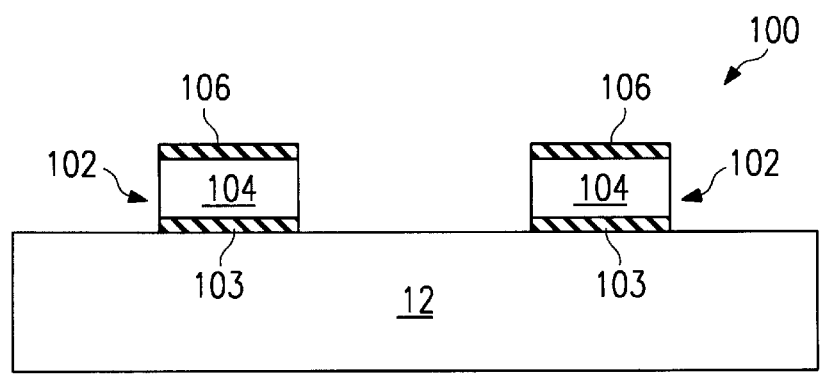
FIGS. 1A through 1F illustrate a method for forming a contact to a substrate.

FIGS. 1A through 1F illustrate a method for forming a self-aligned contact to substrate 12. FIG. 1A illustrates a cross section of semiconductor device 100 during fabrication, which already includes gates 102 formed overlying substrate 12. Substrate 12 comprises silicon, silicon on insulator (SOI), or any other appropriate substrate for semiconductor fabrication. Substrate 12 may comprise a layer of material formed over a substrate of a semiconductor device. In one embodiment, gates 102 comprise a gate dielectric film 103, a conductive film 104 overlying gate dielectric film 103, and an insulating film 106 overlying conductive film 104. Gates 102 may be formed using any suitable technique, for example by: depositing or thermally growing gate dielectric film 103; depositing conductive film 104 overlying gate dielectric film 103; depositing insulating film 106 overlying conductive film 104; and patterning gate dielectric film 103, conductive film 104, and insulating film 106 together to form gates 102.

Gate dielectric film 103 may be formed from oxide, oxynitride, or other suitable material with the desired dielectric properties. Conductive film 104 may be a metal, amorphous polysilicon, polysilicides, tungsten silicides, or other appropriate conductive material, as well as any combination of these films. In one embodiment, insulating film 106 may be formed from nitride with or without some oxide, or from other suitable insulating film or film combinations. In another embodiment, insulating film 106 may comprise a material selected to increase the selectivity of an etch with respect to insulating film 106 and therefore reduce the possibility of a short between the gate conductive film 104 and a subsequently formed contact. Forming insulating film 106 from materials that increase the selectivity of an etch with respect to insulating material 106 allows for increased contact area for the self-aligned contact, enhancing the performance of semiconductor device 100. Suitable materials for insulating material 106 are discussed in greater detail below.

Figure 1B:
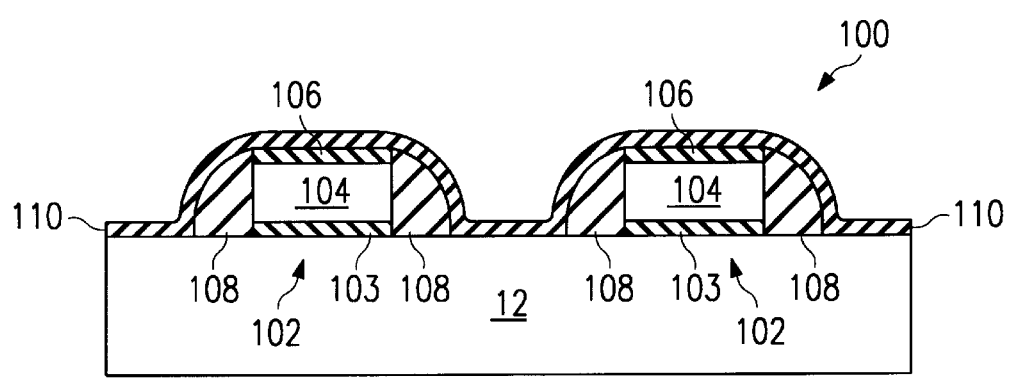

FIG. 1B illustrates device 100 after forming insulating sidewalls 108 and overlying gates 102 and insulating sidewalls 108 with a stopping layer 110. In one embodiment, sidewalls 108 may be formed by depositing an insulating material, such as oxide or nitride, using a low pressure or plasma chemical vapor deposition (CVD) technique; however other deposition techniques may be used. The insulating material is then anisotropically etched until a desired portion of substrate 12 between gates 102 is exposed. In another embodiment, sidewalls 108 may comprise a material that provides increased selectivity for an etch process with respect to the sidewall 108. Stopping layer 110 may be formed, for example, by depositing a layer of appropriate dielectric material overlying gates 102 and insulating sidewalls 108 using a CVD technique. Alternative suitable deposition or growth techniques may also be used to form stopping layer 110. Appropriate material used to form stopping layer 110 is discussed in greater detail below in conjunction with FIG. 1D.

Figure 1C:
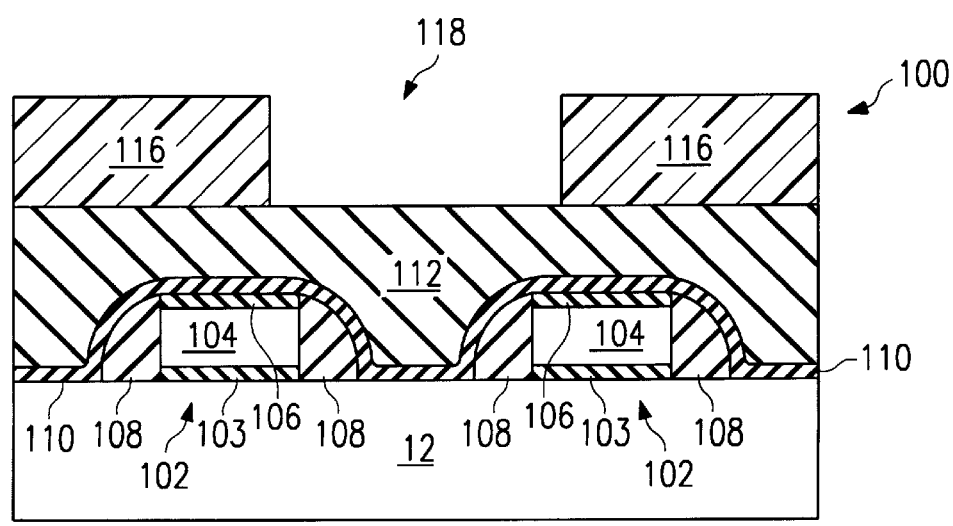

FIG. 1C illustrates device 100 after several additional process steps, including: forming insulating layer 112 overlying stopping layer 110, forming mask 116 overlying insulating layer 112, and patterning mask 116 to define contact region 118. Insulating layer 112 may be formed using any appropriate deposition or growth technique, including without limitation chemical deposition at low pressure or using plasma, spin coating, sputtering, or other deposition or growth techniques. Insulating layer 112 may comprise oxide or a doped oxide, such as for example, boron phosphosilicate glass (BPSG) or other suitable material for electrically insulating components in semiconductor device 110. Mask 116 may comprise any suitable patterning material that can define contact region 118. In one example, mask 116 may be a negative or positive photoresist that is patterned using an appropriate photolithography technique. A planarization technique may be included during any phase of the formation of device 100 illustrated in FIG. 1C. For example, after forming insulating layer 112, a planarization technique may be employed before forming mask 116. Planarization may be accomplished by a reflow process, spin coating, chemical or mechanical polishing, a planarization etch, or other appropriate planarization technique.

Figure 1D:
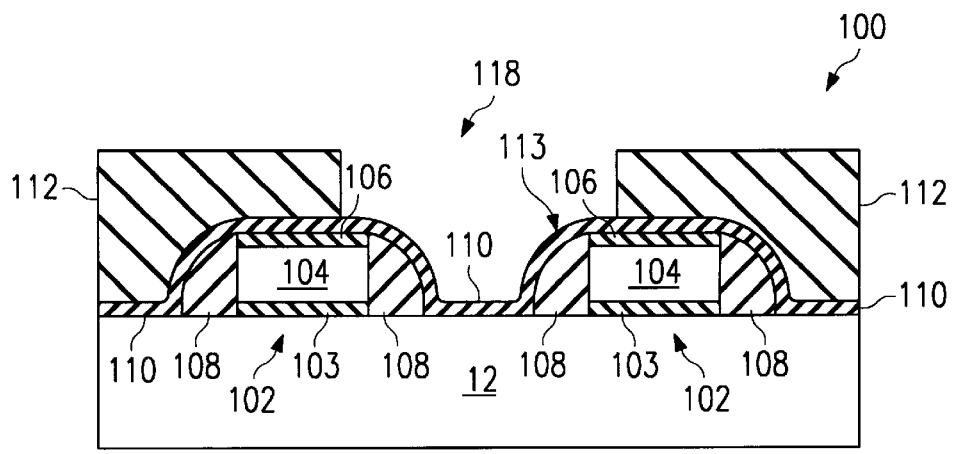

FIG. 1D illustrates device 100 after removing portions of insulating layer 112 in contact region 118. The removal process may be performed by, for example, an anisotropic etch that is selective to stopping layer 110. Example etchants comprise compounds comprising carbon and fluorine; however, other etchants may be used. In one embodiment, insulating layer 112 may be removed with a $C_4F_8$ etchant. During etching, if the etch is not selective enough with respect to stopping layer 110, stopping layer 110 is susceptible to erosion, which is undesirable. Erosion in shoulder region 113 may be particularly deleterious to semiconductor device 110 because a short may develop between conductive material 104 and a subsequently formed self-aligned contact 122, shown in FIG. 1F. Therefore, stopping layer 110 is formed from an appropriate material that increases the selectivity of the etch with respect to stopping layer 110. Materials appropriate for use as stopping layer 110 are discussed in greater detail below. After removal of portions of insulating layer 112, the stopping layer 110 may be removed by a second anisotropic etch selective to sidewall region 108 and insulating film 106, resulting in the structure illustrated in FIG. 1E. The resulting structure comprises contact region 118 defined by the removal of vertically aligned portions of stopping layer 110 and insulating layer 112.

Figure 1E:
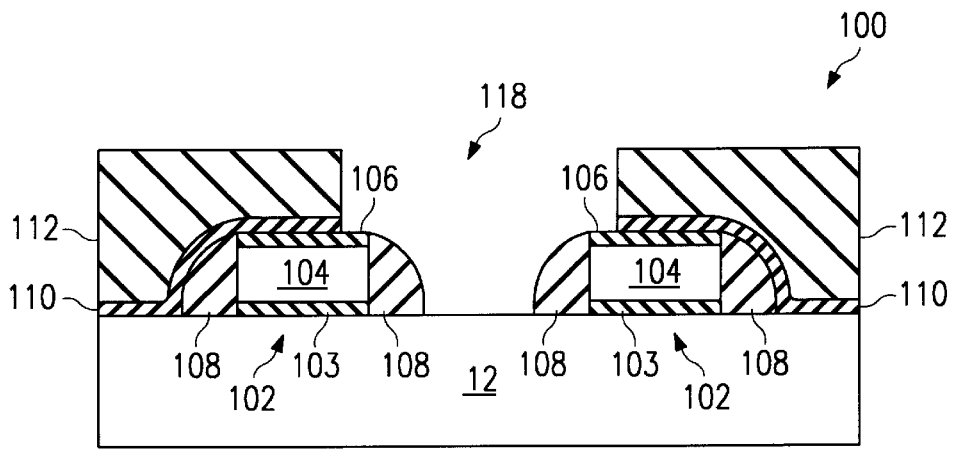

Stopping layer 110 is formed from an appropriate material that may result in an etch that is more selective to stopping insulating layer 110 than to conventional masking materials, such as nitride. If the etch selectivity between insulating layer 112 and stopping layer 110 is not great enough, stopping layer 110 may significantly erode during etching of insulating layer 112. If such erosion occurs, the subsequent etch of stopping layer 110 to expose substrate 12, as illustrated in FIG. 1E, requires a higher degree of selectivity with respect to insulating film 106 and sidewall 108 than would be required if stopping layer 110 experienced no erosion during etching of insulating layer 112. Alternately, insulating film 106 and sidewall 108 could be formed with a greater thickness to compensate for such erosion. Thus, the use of an appropriate material for stopping layer 110 may allow the use of thinner films for insulating film 106 and sidewall 108, which increases contact area and improves planarity. In addition, the use of an appropriate material for stopping layer 110 may allow the insulating film 106 and sidewall 108 to be chosen based on their dielectric properties rather than for their etch selectivity. Furthermore, if etching of either insulating layer 112 or stopping layer 110 results in removal of a significant portion of either sidewall spacer 108 or insulating film 106, an electrical short between the conductive film 104 and subsequently formed contact 122, illustrated in FIG. 1F, may occur. Such a short is most likely to occur near shoulder region 113, illustrated in FIG. 1D. Additionally, in an effort to avoid such a short, an etch may be terminated prematurely, leaving a portion of stopping layer 110 overlying substrate 12 and therefore reducing the contact area. Reduction of contact area may be detrimental to the performance of semiconductor device 100. Therefore, increasing the selectivity of an etch with respect to stopping layer is desirable.

To provide a high etch selectivity ratio between insulating layer 112 and stopping layer 110, stopping layer 110 should be formed from an appropriate material. One such material comprises silicon-rich nitride. Silicon-rich nitride possesses more silicon than stoichiometric nitride. In one embodiment, stopping layer 110 comprises silicon-rich nitride having a silicon to nitrogen ratio greater than 0.75:1. In another embodiment, silicon to nitrogen ratios of approximately 1.5:1 to 2.0:1 may be particularly advantageous. However, any silicon level greater than that required by stoichiometric proportions may be used. The extra silicon in stopping layer 110 affects the chemical reactions associated with the use of common etchants used with nitride, such as $C_4F_8$, making the etchant more selective to stopping layer 110 than it is without the extra silicon in stopping layer 10. Other materials that affect the chemical reactions that occur with various etchants that may be used to etch insulting layer 112 and that maybe used in stopping layer 110 comprise carbon-rich nitride, silicon-rich oxide, organic spin-on-glass, silicon carbide, carbon-rich oxide, nitrided oxide, and organic polymers. As used in this context, "carbon-rich nitride" designates nitride possessing some carbon and "carbon-rich oxide" designates oxide possessing some carbon.

In addition to affecting the chemical reactions associated with an etch, the selection of silicon carbide for use within or as a stopping layer 110 provides a physically harder stopping layer 110 to etch. Therefore, in addition to gains in selectivity attained through chemistry, silicon carbide also affects the mechanical portion of an etch and therefore increases selectivity with respect to stopping layer 110. Other materials that may be used for stopping layer 110 that increase selectivity due to increased hardness comprise carbon-rich nitride, graphite, diamond, nitrided oxide, and boron nitride.

Figure 1F:
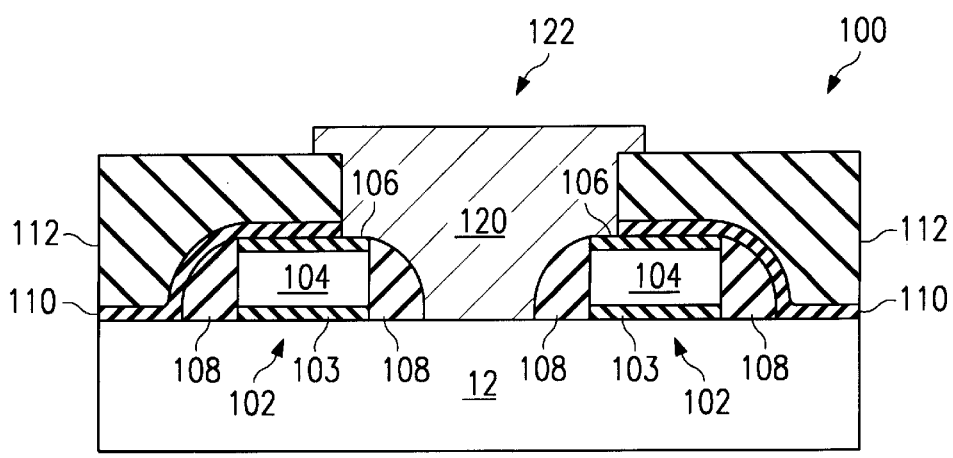

FIG. 1F illustrates device 100 after forming conductive material 120 in contact region 118 to complete fabrication of self-aligned contact, shown generally as element 122. Due to the etch selectivity of first stopping layer 110 the surface area of the contact between the self-aligned contact 122 and the substrate 12 may be maximized. Furthermore, the possibility of a short occurring near shoulder 113 illustrated in FIG. 1B is reduced by the increased selectivity of the etch to layer 110. Self-aligned contact 122 couples substrate 12 and one or more overlying layers using the limited space between gates 102. Further fabrication of device 100 may incorporate contact 122 into a storage node capacitor, transistor, bit line component, word line component, or any other suitable component in a semiconductor device.

Stopping layer 110 comprising one of the above materials may be deposited as discussed above in conjunction with FIG. 1B. Alternatively, a standard dielectric, such as nitride, may be deposited and then implanted with appropriate implants to provide the desired above-mentioned physical or chemical properties for stopping layer 110. Appropriate implants for nitride comprise silicon, boron, and carbon. In one embodiment, an appropriate level of implantation of silicon comprises silicon-rich nitride having a silicon level of silicon to nitrogen ratio greater than 0.75:1. In another embodiment, silicon to nitrogen ratios of approximately 1.5:1 to 2.0:1 may be particularly advantageous. However, any suitable level of implantation that increases the selectivity of the etchant with respect to the stopping layer 110 may be used. Furthermore, rather than implanting silicon into a standard dielectric, such as nitride, to form stopping layer 110, a hexamethyldisiloxane (HMDS) treatment may be applied to nitride with the result of increasing the silicon level of the nitride. Other surface treatments that increase the level of a desired element in materials used to form stopping layer 110 may also be used.

Figure 2:
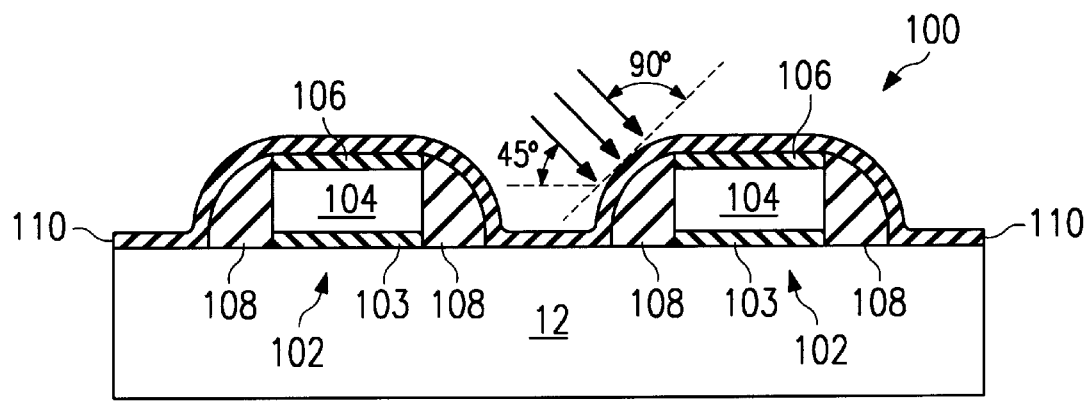
FIG. 2 illustrates a method for implanting a desired implant material at an angle to form a region having a desired concentration distribution of implanted material.

FIG. 2 illustrates one method for implanting suitable materials to form stopping layer 110. As illustrated in FIG. 2, suitable materials are implanted into stopping layer 110 at an angle approximately 45 degrees from the horizontal. In one embodiment, the angle of implantation, measured from a plane parallel to the substrate, is chosen so that the implants will collide in a perpendicular fashion with stopping layer 110 at portions of the stopping layer where etch selectivity is most important. Thus, in one embodiment the angle of implantation selected may be dependent upon the geometry of shoulder region 113. Because the region of stopping layer 110 that is perpendicular to the angle of implantation receives more of the implant material, stopping layer 110 will have a higher concentration of implant in the region of stopping layer 110 perpendicular to the angle of implantation. Thus, by selecting the angle of implantation, the selectivity of the etch to the shoulder region 113 may be selectively increased. In this manner, the increased levels of suitable materials implanted may be concentrated in areas where the selectivity effects are most greatly needed without increasing levels of implanted material unnecessarily in regions of stopping layer 110 where increased selectivity is not as critical. Therefore, any deleterious effects on the manufacturing process that may be attributable to increased levels of implanted material may be minimized. Although a large angle of implantation is illustrated, conventional implantation techniques may also be used to form the desired material for stopping layer 110.

Figure 3:
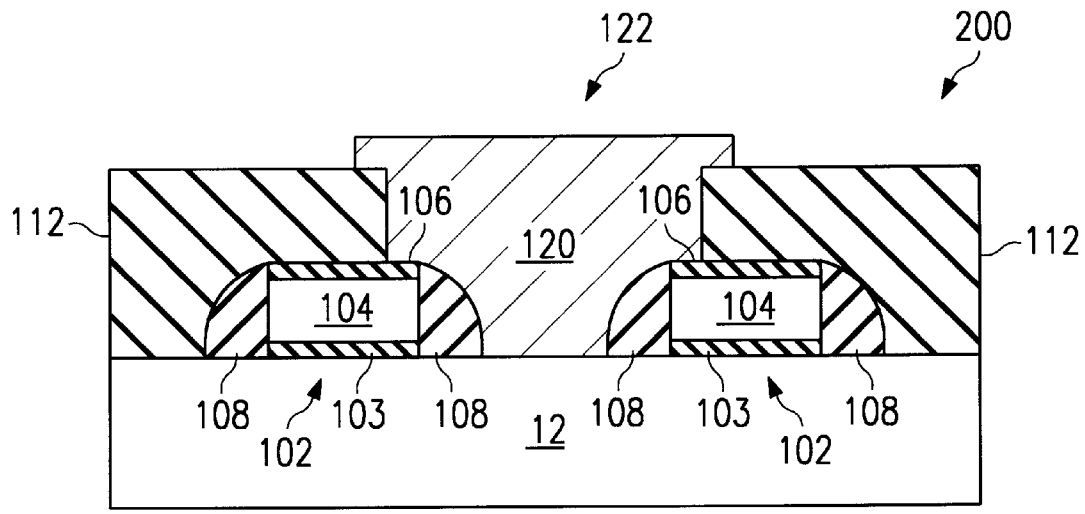
FIG. 3 illustrates a completed self-aligned contact structure manufactured according to another embodiment of the invention.

FIG. 3 illustrates a completed self-aligned contact according to another embodiment of the invention. The formation of the device 200 illustrated in FIG. 3 is substantially similar to the formation of device 100. However, stopping layer 110 is not used. Because stopping layer 110 is not used, only one etch is required to expose the surface of substrate 12 underlying insulating layer 112. In this embodiment sidewall 108 and insulating film 106 may be formed from the materials discussed above in conjunction with the formation of layer 110. The formation of sidewall 108 and thin film 106 may also comprise implantation or surface treatment in a similar manner to that discussed above in conjunction with FIGS. 1A through 1F and FIG. 2. Forming insulating film 106 and sidewall 108 from materials that provide increased etch selectively with respect to insulating film 106 and sidewall 108 decreases the possibility of a short between conductive film 104 and self-aligned contact 122 and additionally maximizes the surface area of the contact between substrate 12 and self-aligned contact 120, which enhances the performance of device 200. In addition, forming insulating film 106 and sidewall 108 from materials that provide increased etch selectivity with respect to insulating film 106 and side wall 108 decreases the possibility of premature termination of an etch because insulating layer 112 may be completely etched without significantly eroding insulating film 106 or sidewall 108. Therefore, the contact area between substrate 12 and self-aligned contact 122 may be maximized.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method for forming a contact to a substrate of a semiconductor device, comprising:

forming a stopping layer overlying the substrate, the stopping layer comprising a carbon-rich nitride;

forming an insulating layer overlying the stopping layer;

etching portions of the insulating layer to define a contact region; and removing portions of the stopping layer in the contact region.

2. The method of claim 1 wherein the step of etching portions of the insulating layer comprises the step of etching portions of the insulating layer with an etchant comprising carbon and fluorine.

3. A method for forming a self-aligned contact to a substrate proximate a gate in a field-effect transistor, comprising:

forming a first film overlying the substrate;

forming a conductive film overlying the first film to form a conductive portion of the gate;

forming a second film overlying the conductive film, the second film formed from a material selected from the group consisting of silicon-rich nitride, silicon-rich oxide, carbon-rich nitride, silicon carbide, boron nitride, organic spin-on-glass, graphite, diamond, carbon-rich oxide, nitrided oxide, and organic polymer;

forming a sidewall associated with the conductive film, the sidewall selected from the group consisting of silicon-rich nitride, silicon-rich oxide, carbon-rich nitride, silicon carbide, boron nitride, organic spin-on-glass, graphite, diamond, carbon-rich oxide, nitrided oxide, and organic polymer;

forming an insulating layer overlying second film and overlying the sidewall; and removing portions of the insulating layer to define a contact region.

4. A method for forming an integrated circuit, comprising the steps of:

forming a nitride layer over a semiconductor body;

implanting an implant material into the nitride layer at a selected angle to provide a higher dopant concentration of implant material at a desired portion of the nitride layer, the implant material selected from the group consisting of silicon, carbon, and boron;

forming an insulating layer over the nitride layer;

etching portions of the insulating layer to define a contact region; and removing portions of the nitride layer in the contact region.

5. The method of claim 4, wherein said selected angle is approximately forty-five degrees.

6. A method for forming an integrated circuit, comprising the steps of:

forming a nitride layer over a semiconductor body;

treating portions of the nitride layer with hexamethyldisilazene to increase silicon content in the nitride layer;

forming an insulating layer over the nitride layer;

etching portions of the insulating layer to define a contact region; and removing portions of the nitride layer in the contact region.

* * * * *